United States Patent
Ito et al.

(10) Patent No.: US 9,006,853 B2
(45) Date of Patent: Apr. 14, 2015

(54) PHOTODETECTOR

(75) Inventors: Kota Ito, Nisshin (JP); Mineki Soga, Nisshin (JP); Cristiano Niclass, Nisshin (JP); Radivoje S. Popovic, Zug (CH); Marc Lany, Lausanne (CH); Toshiki Kindo, Yokohama (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 492 days.

(21) Appl. No.: 13/514,220

(22) PCT Filed: Mar. 22, 2011

(86) PCT No.: PCT/JP2011/056814
§ 371 (c)(1),
(2), (4) Date: Jun. 6, 2012

(87) PCT Pub. No.: WO2011/118571
PCT Pub. Date: Sep. 29, 2011

(65) Prior Publication Data
US 2012/0248295 A1    Oct. 4, 2012

(30) Foreign Application Priority Data
Mar. 25, 2010 (JP) ................. 2010-070284

(51) Int. Cl.
H01L 31/107 (2006.01)
H01L 21/20 (2006.01)
H01L 31/02 (2006.01)
H03F 3/08 (2006.01)

(52) U.S. Cl.
CPC ............ *H01L 31/02027* (2013.01); *H03F 3/08* (2013.01)

(58) Field of Classification Search
USPC ............ 257/114, 233, 293, 438; 438/91, 380
See application file for complete search history.

(56) References Cited

U.S. PATENT DOCUMENTS

| 4,153,835 A | 5/1979 | Lau et al. |
| 4,292,514 A | 9/1981 | Ohtomo |
| 4,438,348 A | 3/1984 | Casper et al. |
| 4,730,128 A * | 3/1988 | Seki .............................. 327/513 |
| 5,548,112 A | 8/1996 | Nakase et al. |

(Continued)

FOREIGN PATENT DOCUMENTS

| JP | 60-017051 B2 | 5/1980 |
| JP | 62-078886 A | 4/1987 |
| JP | 63-077171 A | 4/1988 |
| JP | 63-187672 A | 8/1988 |
| JP | 06-224463 A | 8/1994 |

(Continued)

OTHER PUBLICATIONS

International Search Report of PCT/JP2011/056814, dated Jul. 5, 2011.

*Primary Examiner* — Calvin Lee
(74) *Attorney, Agent, or Firm* — Sughrue Mion, PLLC (57) ABSTRACT

A photodetector disclosed herein comprises an avalanche transistor having a reference junction structure in which temperature characteristics of a current amplification factor are about the same as those of an avalanche photodiode and which is reverse-biased, and a current injection junction structure which injects a reference current to the reference junction structure and which is forward-biased. Voltages to be applied to the avalanche photodiode and the reference junction structure are controlled so that the amplification factor of the reference current amplified in the reference junction structure is retained at a predetermined value, whereby the temperature characteristics of the photodetector utilizing an avalanche effect can be stabilized.

10 Claims, 4 Drawing Sheets (56) References Cited

U.S. PATENT DOCUMENTS

| | | | |
|---|---|---|---|
| 5,578,815 A | 11/1996 | Nakase et al. | |
| 7,214,924 B2 | 5/2007 | Ichino | |
| 7,326,905 B2 | 2/2008 | Kuhara et al. | |
| 7,427,741 B2 | 9/2008 | Koiwai et al. | |
| 8,754,378 B2 * | 6/2014 | Prescher et al. | 250/370.1 |
| 2002/0145107 A1 * | 10/2002 | Deschamps et al. | 250/214 R |

FOREIGN PATENT DOCUMENTS

| | | |
|---|---|---|
| JP | 07-027607 A | 1/1995 |
| JP | 07-176782 A | 7/1995 |
| JP | 11-211563 A | 8/1999 |
| JP | 2005-093834 A | 4/2005 |
| JP | 2005-183538 A | 7/2005 |
| JP | 2006-303524 A | 11/2006 |
| JP | 2008-147416 A | 6/2008 |

\* cited by examiner

PHOTODETECTOR

CROSS REFERENCE TO RELATED APPLICATIONS

This application is a National Stage of International Application No. PCT/JP2011/056814 filed Mar. 22, 2011, claiming priority based on Japanese Patent Application No.2010-070284 filed Mar. 25, 2010, the contents of all of which are incorporated herein by reference in their entirety.

TECHNICAL FIELD

The present invention relates to a photodetector, and more particularly, it relates to a photodetector utilizing an avalanche effect.

BACKGROUND ART

An avalanche photodiode (APD) is used as a light receiving element for detecting a weak optical signal in optical communications, optical radar and the like. When photons enter the APD, electron-hole pairs are generated, and the electrons and positive holes are accelerated by a high electric field, so that collision and ionization successively occur one after another like an avalanche, thereby generating new electrode-hole pairs.

As use modes of the APD, there are a linear mode where the APD is operated at a reverse bias voltage less than a breakdown voltage, and a Geiger mode where the APD is operated at the breakdown voltage or more. In the linear mode, a rate of the annihilated electron-hole pairs (going out from the high electric field) is larger than a rate of the generated electron-hole pairs, so that the avalanche naturally stops. An output current is substantially proportional to the incident light quantity, and hence it can be used for the measurement of the incident light quantity. In the Geiger mode, even the incidence of a single photon can bring about the avalanche phenomenon, and the avalanche can be stopped by lowering an applied voltage to the breakdown voltage. To stop the avalanche phenomenon by lowering the applied voltage is called quenching. The simplest quenching circuit is achieved by connecting a resistance in series with the APD. When the avalanche current is generated, a voltage between resistance terminals increases, and in consequence, the bias voltage of the APD lowers. Then, when the bias voltage becomes less than the breakdown voltage, the avalanche current stops. The quenching circuit makes it possible to take out the incidence of the photons as voltage pulses and to count them. Because the high electric field can be applied to the APD, the APD can respond to weak light at a high speed, and therefore the APD can be widely used in fields such as optical communications and LIDAR.

In the linear mode of the APD, the current amplification factor increases along with the applied voltage, whereas the APD is highly dependent on temperature. Therefore, it becomes a problem in an application field where a wide operating temperature range is required. Furthermore, when the applied voltage is enhanced for retaining a high current amplification factor, a slight change in the applied voltage causes a large error in the multiplication factor. For this reason, it is necessary to improve the stability and the accuracy of a control circuit for retaining a desired multiplication factor in the APD.

On the other hand, in the Geiger mode of the APD, its sensitivity is represented by a photon detection probability and depends on a difference (an overvoltage) between the applied voltage and the breakdown voltage. Because the breakdown voltage is highly dependent on the temperature, for retaining the constant sensitivity regardless of the temperature, it is required to control the applied voltage so that a constant overvoltage is retained.

For example, there are disclosed technologies which perform stable control with respect to the temperature by constituting a circuit in such a manner that the temperature dependency of the applied voltage of the APD is offset by the temperature dependency of the voltage between the base and emitter of a reference transistor (JP62-78886A, U.S. Pat. No. 4,438,348, U.S. Pat. No. 4,153,835, etc.).

Further, there are disclosed technologies which pre-store temperature characteristics of the APD in a memory or the like, and then read from the memory or the like the applied voltage with respect to the temperature measured by a temperature sensor, and apply the read voltage (JP 2006-303524A, JP 11-211563A etc.).

Furthermore, there are disclosed methods which cause the avalanche breakdown in the APD and apply a voltage slightly smaller than the breakdown voltage (JP 7-176782A, JP 7-27607A, etc.).

Still furthermore, there are disclosed methods which directly measure and control a multiplication factor by using a reference light source or a reference light receiving element (JP 2008-147416A, JP 2005-93834A, JP 60-17051B, etc.).

As described above, the voltage application method for compensating the temperature of the APD is broadly classified into a method for setting a target voltage and applying the same, and a method for applying the voltage in such a manner as to retain the constant multiplication factor.

However, in the above technologies, a secondary section of the temperature dependency is not considered, which makes it difficult to precisely control the temperature dependency of the APD. Further, in the above technologies, it is required to individually measure characteristics of elements having different temperature characteristics and to retain them. Moreover, they cannot cope with changes in other environmental factors such as moisture and aging. Furthermore, in the above technologies, a relationship between the voltage slightly smaller than the breakdown voltage and the avalanche multiplication factor is not clear, and therefore the accuracy of the control is poor. Still furthermore, in the above technologies, when the reference light source is used, a highly precise calibration of the light source is required, and noise emitted from the reference light source exerts a harmful influence on S/N ratio in the signal detection. Moreover, the technologies of using the reference light receiving element can scarcely be utilized when a weak and high-speed optical signal can only be obtained.

DISCLOSURE OF THE INVENTION

The present invention is a photodetector using an avalanche photodiode, comprising a reference junction structure in which temperature characteristics of a current amplification factor are substantially identical with those of the avalanche photodiode and which is reverse-biased; a current injection junction structure which injects a reference current to the reference junction structure and is forward-biased; and voltage control means which controls voltages to be applied to the avalanche photodiode and the reference junction structure so that the amplification factor of the reference current to be amplified in the reference junction structure is retained at a predetermined value. Here, the each of the reference junction structure and the current injection junction structure may be a substantially identical structure.

Here, the both of the reference junction structure and the current injection junction structure may be P-N junctions, and to form a transistor.

The reference junction structure may be the P-N junction, and the current injection junction structure to be a schottky junction.

Further, the voltage control means to include current measuring means which measures the current amplified in the reference junction structure, and for the voltage control means to control voltages may be applied to the avalanche photodiode and the reference junction structure in accordance with a current value measured in the current measuring means.

Furthermore, in addition to the voltage control means, a voltage source which applies the voltage to the avalanche photodiode and the reference junction structure may be included, and the current measuring means measures and compares currents that are fed by switching over the voltages to be applied to the reference junction structure by the voltage control means and the voltage source.

The voltage control means may be a current source connected to a collector terminal of the transistor.

The voltage control means may be a current source connected to the base terminal of the transistor.

Further, the reference junction structure and the current injection junction structure may be light-shielded.

Furthermore, the avalanche photodiode and the reference junction structure to have one junction structure, and for current separation means may be included which separates the reference current from a photoelectric current generated by the incident light to the junction structure.

According to the present invention, the photodetector utilizing the avalanche effect can appropriately perform the temperature compensation of the multiplication factor.

BEST MODE FOR CARRYING OUT THE INVENTION

Figure 1:
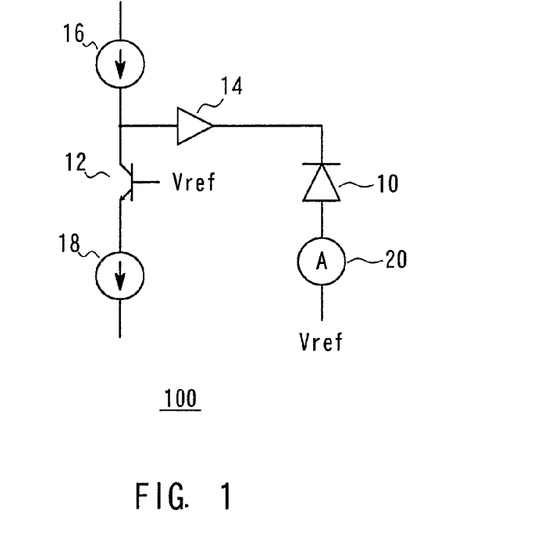
FIG. 1 is a diagram showing a constitution of a photodetector according to the first embodiment.

A photodetector 100 according to the first embodiment comprises, as shown in FIG. 1, an avalanche photodiode (APD) 10, an avalanche transistor (AT) 12, a buffer element 14, a first current source 16, a second current source 18 and an ammeter 20.

Figure 2:
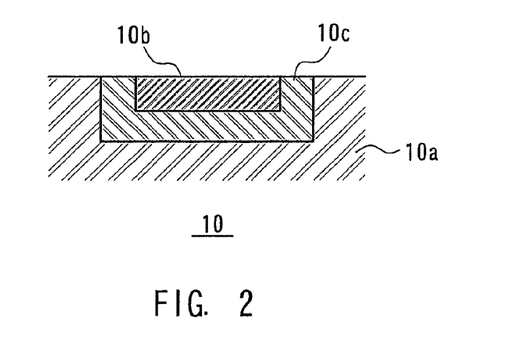
FIG. 2 is a diagram showing a constitution of an avalanche photodiode according to an embodiment of the present invention.

The APD 10 comprises, as shown in a cross-sectional view of elements in FIG. 2, a semiconductor substrate 10*a*, a first well 10*b*, and a second well 10*c*. As the semiconductor substrate 10*a*, there can be utilized a silicon substrate, a gallium arsenide substrate or the like. The second well 10*c* is formed by adding a dopant of a conductivity type opposite to that of the semiconductor substrate 10*a*, to the surface area of the semiconductor substrate 10*a*. The first well 10*b* is formed by adding a dopant of a conductivity type opposite to that of the second well 10*c*, into the forming area of the second well 10*c* formed on the surface area of the semiconductor substrate 10*a*, more shallowly than in the case of the second well 10*c*. Consequently, the first well 10*b* and the second well 10*c* form a P-N junction.

For example, when the semiconductor substrate 10*a* is an N type, the second well 10*c* can be formed by adding a P-type dopant to the semiconductor substrate 10*a* by ion implantation or the like. Further, the first well 10*b* can be formed by adding an N-type dopant to the area where the second well 10*c* is formed, by ion implantation or the like. The characteristics of the APD 10 can be adjusted by appropriately adjusting the dopant concentrations of the first well 10*b* and the second well 10*c*. The N type and the P type may be respectively reversed.

Figure 3:
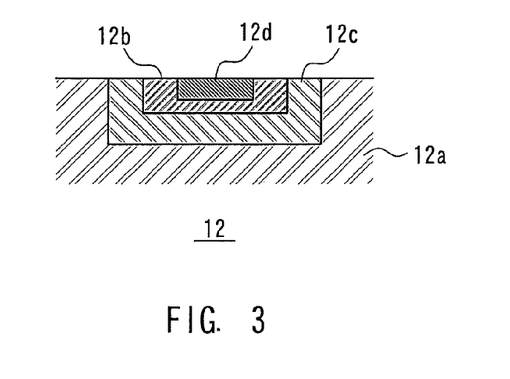
FIG. 3 is a diagram showing a constitution of an avalanche transistor according to the embodiment of the present invention.

The AT 12 comprises, as shown in a cross-sectional view of elements in FIG. 3, a semiconductor substrate 12*a*, a first well 12*b*, a second well 12*c* and a diffusion area 12*d*. As the semiconductor substrate 12*a*, there can be utilized a silicone substrate, a gallium arsenide substrate or the like. The second well 12*c* is formed by adding a dopant of a conductivity type opposite to that of the semiconductor substrate 12*a*, to the surface area of the semiconductor substrate 12*a*. The first well 12*b* is formed by adding a dopant of a conductivity type opposite to that of the second well 12*c*, into the forming area of the second well 12*c* formed on the surface area of the semiconductor substrate 12*a*, more shallowly than in the case of the second well 12*c*. Further, the diffusion area 12*d* is formed by adding a dopant of a conductivity type opposite to that of the first well 12*b*, into the forming area of the first well 12*b* formed on the surface area of the semiconductor substrate 12*a*, more shallowly than in the case of the first well 12*b*. Consequently, the transistor is formed where the first well 12*b* is a base, the second well 12*c* is a collector and the diffusion area 12*d* is an emitter.

For example, when the semiconductor substrate 12*a* is the N type, the second well 12*c* can be formed by adding a P-type dopant to the semiconductor substrate 12*a* by ion implantation or the like. The first well 12*b* can be formed by adding an N-type dopant to the area where the second well 12*c* is formed, by ion implantation or the like. Further, the diffusion area 12*d* can be formed by adding a P-type dopant to the area where the first well 12*b* is formed, by ion implantation or the like. The characteristics of the AT 12 can be adjusted by appropriately adjusting the dopant concentrations of the first well 12*b*, the second well 12*c* and the diffusion area 12*d*. The N type and the P type may be respectively reversed.

It is also suitable for the reference junction structure and the current injection junction structure of the AT 12 to be light-shielded by being covered with a light-shielding type membrane or the like. This constitution can prevent the incidence of light to the reference junction structure and the current injection junction structure from the outside, thereby suppressing the generation of a photoelectric current that could be a cause of error.

Here, the temperature characteristics of the current amplification factors of the P-N junction formed of the first well 10b and the second well 10c of the APD 10, and the P-N junction formed of the first well 12b and the second well 12c of the AT 12 are assumed to substantially accord with each other. As a method for enabling the temperature characteristics to substantially accord with each other, there can be contrived a variation which is obtained by controlling substances to be doped, shapes of the respective wells and junction shapes thereof, but practically, it is suitable for the structure of the P-N junction to be formed of the first well 10b, and for the second well 10c of the APD 10 to be formed so as to be identical with or similar to the structure of the P-N junction formed of the first well 12b and the second well 12c of the AT 12, thereby enabling the temperature characteristics to substantially accord with each other.

For example, the first well 10b of the APD 10 and the first well 12b of the AT 12 are set to have the same doping concentration, and the second well 10c of the APD 10 and the second well 12c of the AT 12 are set to have the same doping concentration. More specifically, it is suitable for the semiconductor substrates 10a and 12a to be made of the same substrate, the first wells 10b and 12b to be formed on the surface areas thereof in an identical step, and the second wells 10c and 12c to be additionally formed in an identical step.

The photodetector 100 is constituted by including the above APD 10 and AT 12. The APD 10 is an element for photodetection where the temperature is compensated. Further, the base-collector junction of the AT 12 is the reference junction structure, and the base-emitter junction thereof is the current injection junction structure.

The first current source 16 is connected so that a current flows inward through the second well 12c (the collector) of the AT 12, and the second current source 18 is connected so that the current flows outward through the diffusion area 12d (the emitter). Further, the second well 12c (the collector) of the AT 12 is connected to the second well 10c (a cathode) of the APD 10 via the buffer element 14. Furthermore, the first well 12b of the AT 12 is set to have an identical reference voltage Vref to that of the first well (an anode) of the APD 10. Moreover, the ammeter 20 for detection is connected to the first well (the anode) of the APD 10.

The current injected from the emitter of the AT 12 by the second current source 18 is avalanche-multiplied in the base-connector junction and flows as a collector current. The collector current is set by the first current source 16, so that a ratio of current values of the first current source 16 and the second current source 18 becomes a multiplication factor in the base-collector junction. In that case, a reverse bias voltage of the base-collector junction is buffered by the buffer element 14, and is then applied to the APD 10 as a reverse bias voltage.

Here, the temperature characteristics of the P-N junction formed of the first well 10b and the second well 10c of the APD 10 and the temperature characteristics of the P-N junction formed of the first well 12b and the second well 12c of the AT 12 are set to substantially accord with each other, and hence the multiplication factor of the APD 10 is kept at a substantially identical value to the amplification voltage of the AT 12, even if the temperature changes, and thus a relation between the reverse bias voltage of the APD 10 and the multiplication factor changes. Accordingly, the multiplication factor of the APD 10 can be retained at a predetermined value regardless of the temperature by adjusting the current values of the first current source 16 and the second current source 18.

The multiplication factor of the reference junction structure which has temperature characteristics identical with or close to those of the APD 10 is retained at the predetermined value, so that the multiplication factor of the APD 10 can also be precisely and stably controlled. Further, the injection of the current can retain the multiplication factor at the predetermined value, and hence a simple circuit constitution can be provided compared with a case of using the reference light source or the like, and the influence of environment light and the like is scarcely exerted.

Further, the reference junction structure and the current injection junction structure can be provided as a single transistor, and a transistor manufacturing technique that is widely used can be utilized to inexpensively constitute the circuit.

Furthermore, the first current source 16 to be connected to the collector of the AT 12 as the voltage control means can be provided by using two MOSFETs. In an initial state at the application of power, no avalanche phenomenon occurs in the AT 12, and the reference current injected into the emitter is output to the collector without being amplified. At this time, the voltage is not sufficiently applied to the MOSFETs constituting the first current source 16, so that they operate in a linear region and output a current smaller than the set current. Afterward, when a sufficient time lapses to cause the avalanche phenomenon in the AT 12, the collector current is amplified and a sufficiently large voltage is also applied to the MOSFETs constituting the first current source 16, so that they operate in a saturated state. At this time, the current is restricted to the preset value. As described above, in the application of power, the nonlinearity at a time when the AT 12 transits from a state where no avalanche phenomenon occurs to a state where the avalanche amplification occurs can be offset by the nonlinearity of the MOSFETs, thereby suppressing the instability of the circuit at the application of power.

Figure 4:
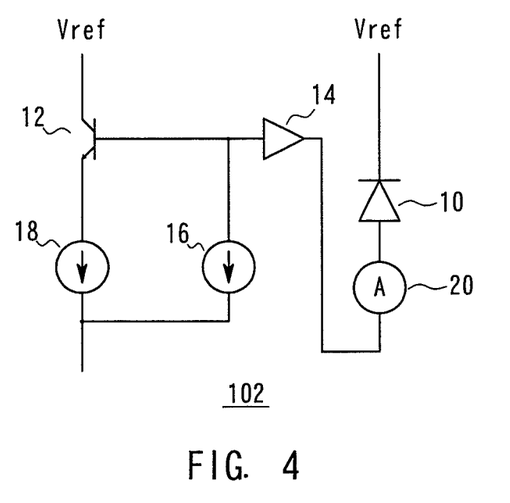
FIG. 4 is a diagram showing a constitution of another example of the photodetector according to the first embodiment.

It is to be noted that in the present embodiment, the first current source 16 and the second current source 18 are connected to the collector and the emitter of the AT 12 respectively, but as shown in FIG. 4, the first current source 16 and the second current source 18 may be connected to the base and the emitter of the AT 12 respectively. In this case, the base voltage of the AT 12 is applied to the anode of the APD 10 via the buffer element 14. Further, the collector of the AT 12 has an identical reference voltage Vref to that of the cathode of the APD 10.

As described above, the first current source 16 to be connected to the base of the AT 12 as the voltage control means can be provided by using two MOSFETs. In this case, since the DC voltage level of the first current source 16 is substantially equal to the voltage level of the current injection (the base-emitter voltage of the AT 12 is about 0.6V), matching of the current source and the current injection means can easily be achieved.

Figure 5:
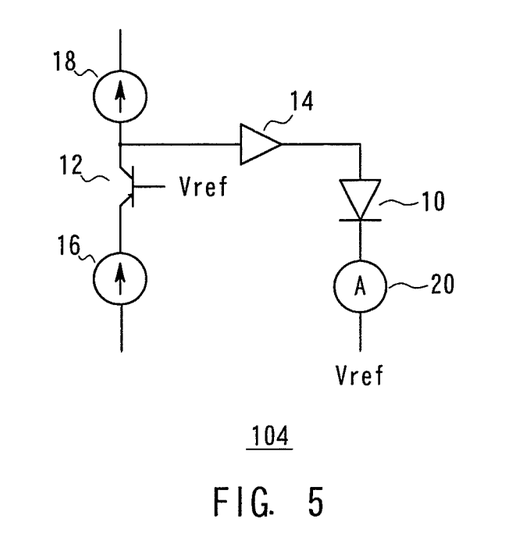
FIG. 5 is a diagram showing a constitution of another example of the photodetector according to the first embodiment.

Alternatively, as shown in FIG. 5, the AT 12 may be a P-N-P transistor. In this case, the voltage of the collector of the AT 12 is applied to the anode of the APD 10. Further, the ammeter 20 is connected to the cathode of the AT 12.

Further, in the present embodiment, an N-P-N or P-N-P transistor is used as the AT 12, but the emitter-base junction may be replaced with a schottky junction. The employment of the schottky junction can reduce the voltage applied to the current injection junction structure compared with that of the P-N junction, so that power consumption in the current injection junction structure can be reduced compared with that of the PN junction.

Figure 6:
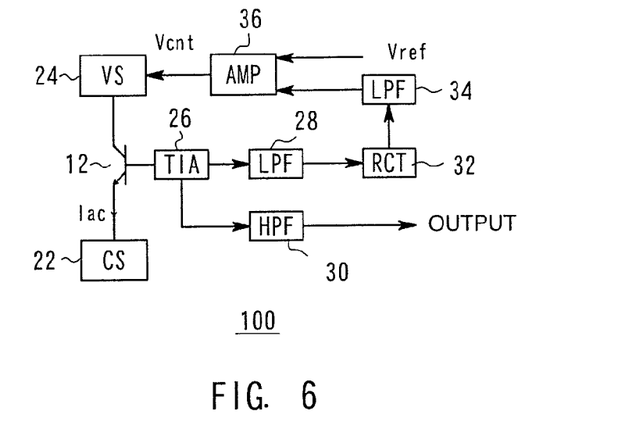
FIG. 6 is a diagram showing a constitution of a photodetector according to the second embodiment.

Next, a description will be given of the second embodiment. A photodetector 200 in the second embodiment comprises, as shown in FIG. 6, an avalanche transistor (AT) 12, a current source 22, a voltage source 24, a current amplifier (TIA: transimpedance amplifier) 26, a low-pass filter (LPF) 28, a high-pass filter (HPF) 30, a rectifier 32, a low-pass filter (LPF) 34 and a differential amplifier 36.

According to the constitution of the present embodiment, a collector-base junction of the AT 12 functions as a reference function structure, and at the same time also functions as an avalanche photodiode (APD). Moreover, an emitter-base junction of the AT 12 functions as a current injection junction structure.

An AC reference current Iac is injected from an emitter of the AT 12 by the current source 22, is avalanche-multiplied in the base-collector junction of the AT 12, and flows as a collector current. A base current of the AT 12 is converted into a voltage by the TIA 26 and is input to the LPF 28 and the HPF 30. The LPF 28 serves as a filter having a frequency pass band which passes signals of a frequency band of the AC reference current Iac and shuts off signals of a frequency band of a photoelectric current generated by the irradiation of light. Components of the AC reference current Iac that are avalanche-multiplied are filtered by the LPF 28, smoothed by the rectifier 32 and the LPF 34, and input to the differential amplifier 36. The differential amplifier 36 outputs a control voltage Vcnt to the voltage source 24 in accordance with a difference between the reference voltage Vref and the voltage output from the LPF 34. The voltage source 24 controls and outputs a reverse bias voltage which is applied to the collector of the AT 12 by the control voltage Vcnt. This feedback loop is a negative feedback loop, which makes it possible to constantly retain the avalanche multiplication factor in the collector-base junction of the AT 12.

On the other hand, photodetection is performed by applying light to the collector-base junction of the AT 12. Here, if a signal light frequency is sufficiently higher than an AC reference current frequency, a photoelectric current can be separated from a current based on the AC reference current Iac, followed by detection. In other words, the frequency characteristics of the LPF 28 and the HPF 30 are designed in such a manner that a current generated by the signal light incidence is shut off by the LPF 28 but it is passed through the HPF 30. Consequently, the HPF 30 can only separate the current generated by the signal light incidence from the signals where the base current of the AT 12 is converted into the voltage by the TIA 26, followed by outputting the separated current.

For example, for the purpose of detecting the signal light of 1 MHz, if it is presumed that the AC reference current Iac is a current of a 1 kHz frequency, it is desirable for the LPF 28 to be a filter which passes signals of 100 kHz or less, and for the HPF 30 to be a filter which passes signals of 1000 kHz or more.

Further, according to the constitution of the present invention, the TIA 26 is connected to the base of the AT 12, but may be connected to the collector of the AT 12. In this case, the collector current is converted into a voltage by the TIA 26, the resultant signals are frequency-separated by the LPF 28 and the HPF 30, and the components based on the reference current Iac are smoothed by the rectifier 32 and the LPF 34. The smoothed voltage is compared with the reference voltage by the differential multiplier 36, and the voltage source 24 is controlled in accordance with the resultant difference to control the base voltage of the AT 12. Such a constitution can also obtain an identical function to the above constitution.

Figure 7:
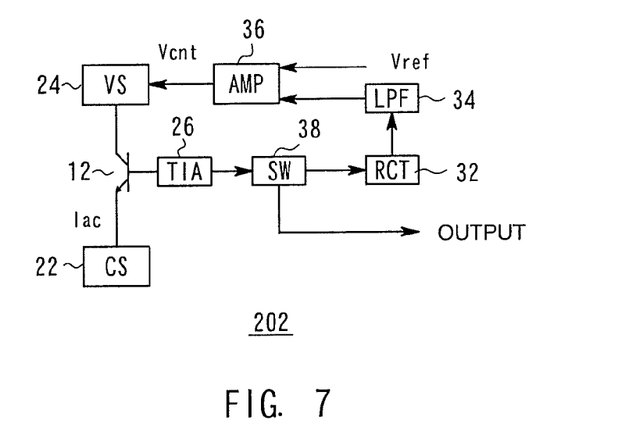
FIG. 7 is a diagram showing a constitution of another example of the photodetector according to the second embodiment.

Furthermore, according to the constitution of the present invention, the reference current and the signal current are separated by the frequency division system, but may be separated by a time-sharing system. That is, as in the photodetector 202 shown in FIG. 7, a switch 38 is provided instead of providing the LPF 28 and the HPF 30. During a period when the reference current is modulated with an alternating current, the output from the TIA 26 is switched over to the output from the rectifier 32, and during a period when the optical signals are input, the output from the TIA 26 is switched over to the output from an output terminal, while fixing the control voltage Vcnt.

Figure 8:
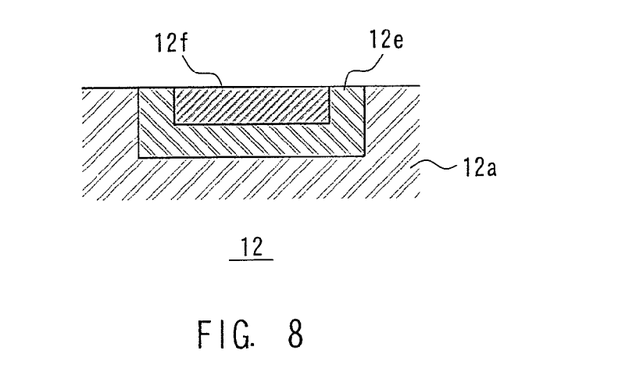
FIG. 8 is a diagram showing a constitution of an avalanche transistor according to an embodiment of the present invention.

In addition, the AT 12 may be a transistor of such a structure as shown in FIG. 8. That is, the AT 12 comprises a semiconductor substrate 12a, a well 12e, and a diffusion area 12f. The well 12e is formed by adding a dopant of a conductivity type opposite to that of the semiconductor substrate, to the surface area of the semiconductor substrate 12a. The diffusion area 12f is formed by adding a dopant of the conductivity type opposite to that of the well 12e, to the forming area of the well 12e formed on the surface area of the semiconductor substrate 12a, more shallowly than in the case of the well 12e. Consequently, the transistor is formed where the well 12e is a base, the semiconductor substrate 12a is an emitter and the diffusion area 12f is a collector.

When such an AT 12 is used, a junction between the well 12e and the semiconductor substrate 12a becomes a current injection junction structure, and a junction between the well 12e and the diffusion area 12f becomes a reference junction structure. That is, an interval between the well 12e and the semiconductor substrate 12a is forward-biased, and the semiconductor substrate 12a serves as the emitter to inject the reference current. On the other hand, when used as the APD, an interval between the well 12e and the semiconductor substrate 12a is reverse-biased, and the APD is employed in such a state as electrically isolated from the semiconductor substrate 12a.

Furthermore, in the constitution of the present embodiment, the AT 12 serves as an N-P-N transistor, but may be used as a P-N-P transistor like the constitution of the first embodiment.

As described above, the current measuring means which measures the current amplified in the reference junction structure is provided, and the voltage applied to the AT 12 is controlled so as to approximate the value measured by the current measuring means to a current target value, whereby the amplification factor can be retained at a constant value even if the reference current to be injected through the current injection junction structure fluctuates due to external factors such as temperature change and the like.

Moreover, when the photoelectric current and the reference current are separately measured, the multiplication factor of the current can be precisely controlled while suppressing the influence of the ambient light. In addition, the AT 12 and the reference junction structure are in the form of the single junction structure, so that elements thereof can be miniaturized.

Figure 9:
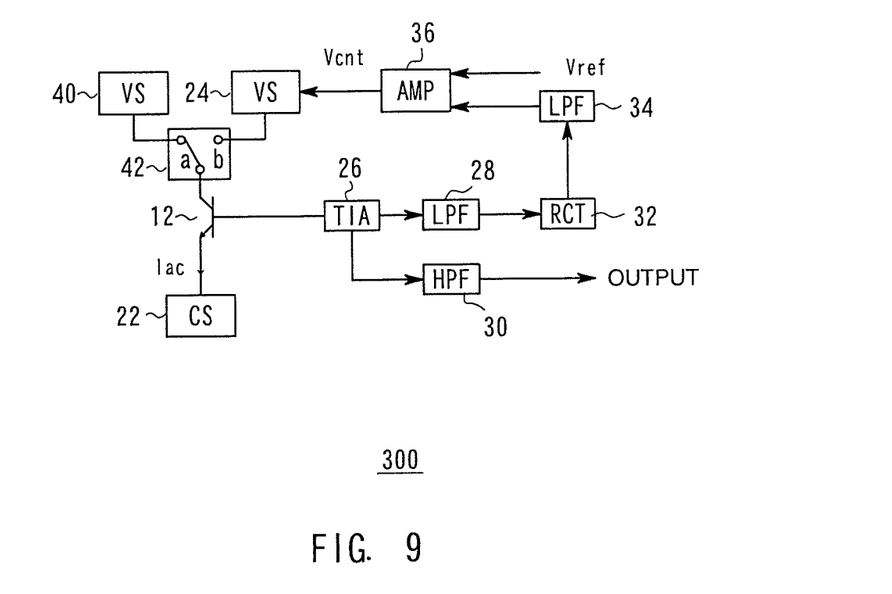
FIG. 9 is a diagram showing a constitution of a photodetector according to the third embodiment.
Figure 10:
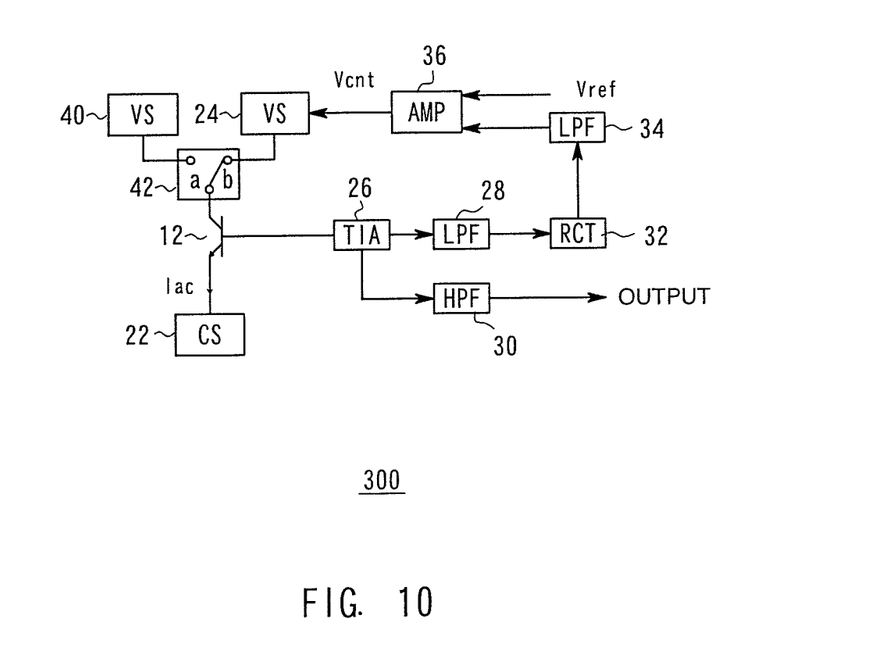
FIG. 10 is a diagram showing a constitution of the photodetector according to the third embodiment.

Next, a description will be given of the third embodiment. A photodetector 300 according to the third embodiment comprises, as shown in FIG. 9 and FIG. 10, an avalanche transistor (AT) 12, a current source 22, a voltage source 24, a current amplifier (TIA: transimpedance amplifier) 26, a low-pass filter (LPF) 28, a high-pass filter (HPF) 30, a rectifier 32, a low-pass filter (LPF) 34 and a differential amplifier 36, and further includes a second voltage source 40 and a switch 42. The components having identical reference numerals to those of the photodetector 200 in the constitution of the second embodiment are assumed to have identical functions to those of the photodetector 200, if not otherwise specified in the following.

The constitution of the present embodiment is effectual in a case where an emitter-collector current transfer ratio α is unspecified or it fluctuates with time. It is to be noted that in a bipolar transistor causing no avalanche phenomenon, the emitter-collector current transfer ratio α is defined by the following mathematical expression (1) using a collector current $I_C$, a base current $I_B$, an emitter current $I_E$ and a bipolar transistor DC current amplification ratio $h_{FE}$. The emitter-collector transfer ratio α indicates a ratio at which carriers injected into the emitter reach the collector without being recombined in the base, and since the avalanche phenomenon occurs in the collector-base junction, the current for causing the avalanche phenomenon is obtained by multiplying the current injected into the emitter by the emitter-collector current transfer ratio α.

[Mathematical expression 1]

$$\alpha = \frac{I_C}{I_E} = \frac{I_C}{I_C + I_B} = \frac{h_{FE}}{h_{FE} + 1} \quad (1)$$

Also in the constitution of the present embodiment, the collector-base junction of the AT 12 functions as the reference junction structure and simultaneously functions as an avalanche photodiode (APD). Further, an emitter-base junction of the AT 12 functions as a current injection junction structure. Generally, the bipolar transistor for signal amplification is so designed as to approximate the emitter-collector current transfer ratio α to 1 as much as possible. On the other hand, in the constitution of the present embodiment, the collector-base junction of the AT 12 is commonalized with the avalanche photodiode (APD), and hence it is not always true that the emitter-collector current transfer ratio α is close to 1. Especially when a substrate is used as the emitter, a distance between the emitter and the collector is elongated, and in consequence, the emitter-collector current transfer ratio α is low (for example, 0.1 or less).

In such a constitution, first of all, the emitter-collector current transfer ratio α is found. As shown in FIG. 9, the switch 42 is connected to an a-side, and the collector of the AT 12 is connected to the second voltage source 40. The second voltage source 40 outputs a voltage lower than that of the voltage source 24 to actuate the AT 12 in a state where the avalanche phenomenon is not caused. In this state, the base current $I_B$ of the AT 12 is converted into a voltage by the TIA 26, passes through the LPF 28 and the HPF 30 to be converted to a voltage value corresponding to the base current $I_B$ of the AT 12, and is input to the differential amplifier 36. Consequently, in the differential amplifier 36, the emitter-collector current transfer ratio α is detected.

For example, a voltage is applied from the second voltage source 40 so that the collector current $I_C$ of the AT 12 becomes about 0.9 mA, and when a voltage value corresponding to 0.1 mA of the base current $I_B$ is input to the differential amplifier 36, the emitter-collector current transfer ratio α is detected as 0.9 from the mathematical expression (1).

After the emitter-collector current transfer ratio has been detected as described above, when the avalanche multiplication factor is multiplied by X in the base-collector junction of the AT 12, the reference voltage Vref of the differential amplifier 36 is to be set so that the collector current $I_C$ takes a mathematical expression (2) with respect to the AC reference current Iac. That is, the reference voltage Vref of the differential amplifier 36 is to be set so that the base current $I_B$ takes a mathematical equation (3).

[Mathematical expression 2]

$$(\text{Reference Current Amplitude}) \times \alpha \times X \quad (2)$$

[Mathematical expression 3]

$$(\text{Reference Current Amplitude}) \times (\alpha \times X - 1) \quad (3)$$

For example, when the amplification factor of the avalanche amplification is multiplied by 100, the collector current $I_C$ and the base current $I_B$ are to be set as X=100 in the mathematical expression (2) and the mathematical expression (3).

After the reference voltage Vref of the differential amplifier 36 has been set as described above, the switch 42 is connected to a b-side as shown in FIG. 10, whereby a control voltage Vcnt corresponding to a difference between the reference voltage Vref and a voltage output from the LPF 34 is output from the differential amplifier 36 to the voltage source 24. Then, the voltage source 24 controls and outputs a reverse bias voltage so that a collector current $I_C$ that multiplies the avalanche multiplication factor by X flows to the collector of the AT 12 in accordance with the control voltage Vcnt.

In this state, the AC reference current Iac is injected from the emitter of the AT 12 by the current source 22, is avalanche-multiplied in the base-collector junction of the AT 12, and flows as the collector current. The base current of the AT 12 is converted into a voltage by the TIA 26, and input to the LPF 28 and the HPF 30. The AC reference current Iac is smoothed via the LPF 28, the rectifier 32 and the LPF 34, and is input to the differential amplifier 36. The differential amplifier 36 outputs, to the voltage source 24, the control voltage Vcnt corresponding to a difference between the reference voltage Vref that is set as described above and the voltage that is output from the LPF 34. This feedback loop is negatively fed back, whereby the avalanche multiplication factor in the collector-base junction of the AT 12 can be constantly retained.

On the other hand, in an identical manner to the photodetector 200 in the constitution of the second embodiment, the photodetection is performed by applying light to the collector-base junction of the AT 12. Here, if a signal light frequency is sufficiently higher than an AC reference current frequency, a photoelectric current can be separated from a current based on the AC reference current Iac, followed by detection.

Also in the constitution of the present embodiment, connection to the collector of the AT 12 may be performed. Further, also in the constitution of the present embodiment, the reference current and the signal current are separated from each other by a frequency division system, but the separation may be performed by a time-sharing system. Furthermore, the AT 12 may be a transistor having a structure as shown in FIG. 8. In addition, in the constitution of the present embodiment the AT 12 is an NPN transistor, but it may be a PNP transistor as in the case of the constitution of the first embodiment.

INDUSTRIAL APPLICABILITY

According to the present invention, temperature characteristics of a photodetector utilizing an avalanche effect can be stabilized.

The invention claimed is:

1. A photodetector using an avalanche photodiode, comprising:
   a reference junction structure which has temperature characteristics of a current amplification factor substantially identical to those of the avalanche photodiode and which is reverse-biased;
   a current injection junction structure which injects a reference current to the reference junction structure and which is forward-biased; and
   voltage control means which controls voltages to be applied to the avalanche photodiode and the reference junction structure so that the amplification factor of the reference current that is amplified in the reference junction structure is retained at a predetermined value.

2. The photodetector according to claim 1, wherein
each of the reference junction structure and the current injection junction structure is a substantially identical structure.

3. The photodetector according to claim 1, wherein
the reference junction structure is a P-N junction, and the current injection junction structure is a schottky junction.

4. The photodetector according to claim 1, wherein the reference junction structure and the current injection junction structure are light-shielded.

5. The photodetector according to claim 1, wherein
the avalanche photodiode and the reference junction structure form a single junction structure, and
the photodetector comprises current separation means which separates a photoelectric current generated by incident light onto the junction structure from the reference current.

6. The photodetector according to claim 1, wherein
the voltage control means includes current measuring means which measures a current amplified by the reference junction structure, and controls voltages to be applied to the avalanche photodiode and the reference junction structure in accordance with a current value measured in the current measuring means.

7. The photodetector according to claim 6, comprising, in addition to the voltage control means, a voltage source which applies voltages to the avalanche photodiode and the reference junction structure, wherein
the current measuring means measures and compares currents that are passed by switching over the voltages to be applied to the reference junction structure by the voltage control means and the voltage source.

8. The photodetector according to claim 1, wherein
both of the reference junction structure and the current injection junction structure are P-N junctions, and form a transistor.

9. The photodetector according to claim 8, wherein the voltage control means is a current source that is connected to a collector terminal of the transistor.

10. The photodetector according to claim 8, wherein the voltage control means is a current source that is connected to a base terminal of the transistor.

* * * * *